United States Patent [19]

Potember et al.

[11] Patent Number: 4,574,366

[45] Date of Patent: Mar. 4, 1986

[54] OPTICAL STORAGE AND SWITCHING DEVICES USING ORGANIC CHARGE TRANSFER SALTS

[75] Inventors: Richard S. Potember; Theodore O. Poehler, both of Baltimore; Richard C. Benson, Columbia, all of Md.

[73] Assignee: The Johns Hopkins University, Baltimore, Md.

[21] Appl. No.: 464,771

[22] Filed: Feb. 7, 1983

[51] Int. Cl.[4] .............................................. G11C 11/00
[52] U.S. Cl. .................................... 365/153; 365/127
[58] Field of Search ............... 365/107, 114, 119, 153, 365/127; 357/8

[56] References Cited

U.S. PATENT DOCUMENTS 3,983,542  9/1976  Ovshinsky ............................. 365/153
4,371,883  2/1983  Potember et al. ....................... 357/2

OTHER PUBLICATIONS

Solid State Communications, vol. 45, No. 2, 1983, pp. 165-169.
"Optically Induced Transformations of Metal TCNQ Materials"-Office of Naval Research Technical Report No. TR82-02; Sep. 17, 1982.
1973 SED International Symposium Digest of Technical Papers-New York; May 15-17, 1973, pp. 146-147.

Primary Examiner—James W. Moffitt
Attorney, Agent, or Firm—Robert E. Archibald; Howard W. Califano

[57] ABSTRACT

Optical devices using an organic charge transfer salt as the switching and storage media are disclosed. Generally, a light beam of a given intensity directed to a film of certain organic charge transfer salts causes the illuminated area to change from a first to a second state. This electrochemical process is reversible with heat energy transforming the illuminated area back into the first state. The first and second states have identifiably different optical and electrical properties. The organic charge transfer salt is used to fabricate an erasable or permanent optical memory and a threshold on bistable optoelectronic switch.

75 Claims, 14 Drawing Figures

|← 75μ →|

200X  5KV

| ORGANIC CHARGE TRANSFER SALT | COLOR OF NEUTRAL ORGANIC ELECTRON ACCEPTOR MOIETY | COLOR OF ORGANIC SALT IN FIRST STATE | COLOR OF ORGANIC SALT IN SECOND STATE |
|---|---|---|---|
| Ag TCNQ | YELLOW | PURPLE | YELLOW-GREEN |
| Cu TCNQ | YELLOW | BLUE-BLACK | YELLOW |
*FIG. 5*
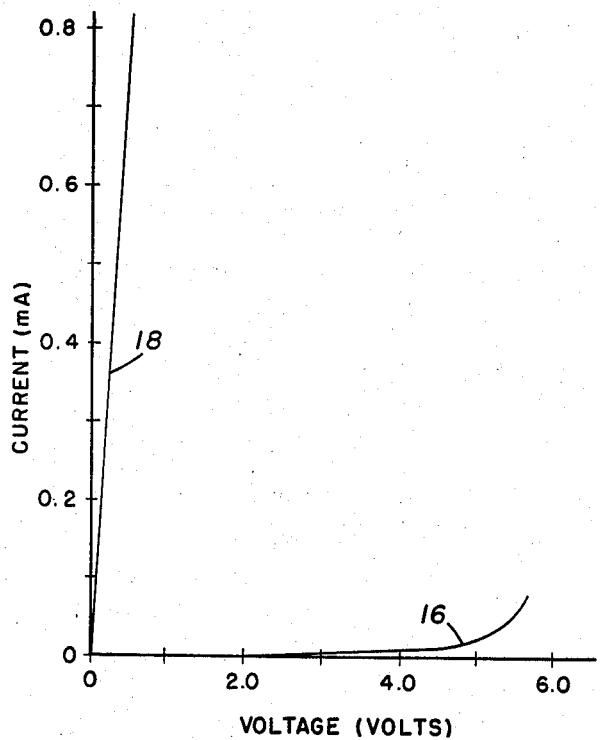
*FIG. 6*
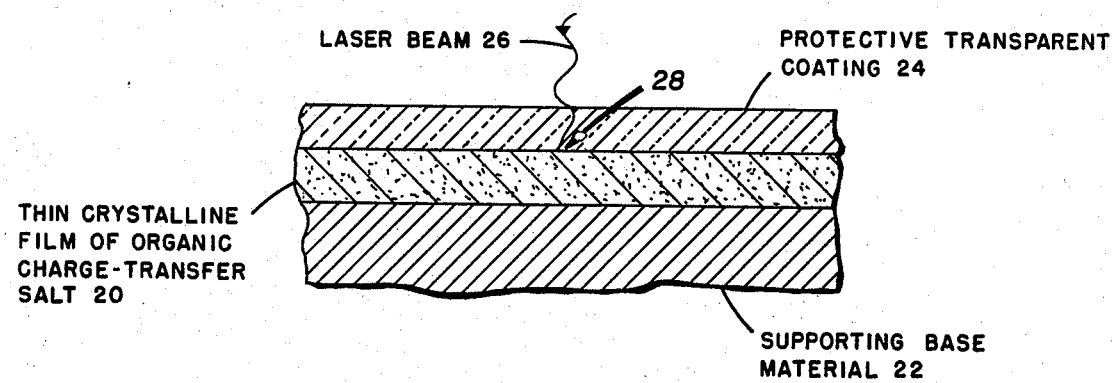
*FIG. 8*

OPTICAL STORAGE AND SWITCHING DEVICES USING ORGANIC CHARGE TRANSFER SALTS

STATEMENT OF GOVERNMENTAL INTEREST

The invention herein described was made in the course of or under a contract or subcontract thereunder with the Department of the Navy.

BACKGROUND AND/OR ENVIRONMENT OF THE INVENTION

1. Field of the Invention

The present invention pertains generally to the use of organic charge transfer salts to produce optical devices and more particularly to the use of organic charge transfer salts as a memory media for an optical memory system and as the switching mechanism for an optoelectronic switch.

2. Description of the Contemporary and/or Prior Art

With the advent of the information revolution, recent research activities have focused on developing optical storage systems and optoelectronic switches. The interaction of laser light with matter has been intensely investigated because of its potential use in optical memory systems. Potentially, optical recording can produce information storage densities in excess of 100 million bits per square centimeter. Currently optical memory devices rely on photochemical hole burning (PHB) in which a laser pits the material in an effort to store data. An article entitled "Laser Marking of a Thin Organic Film" by J. J. Wrobel et al, *Applied Physics Letter* 40, (11), June 1, 1982, describes such a technique using a laser beam to burn holes in a thin organic film. Similarly, optical writing on a blue, sputtered iridium oxide films is reported by Mabosch et al in *Applied Physics Letter* 41 (1), July, 1, 1982. This technique uses an optical writing mechanism to thermally induce dehydration at temperatures below the melting point of the optical medium. An article entitled "Light-induced Phenomena in Dye-polymer Systems" by V. Novotny et al, *The Journal of Applied Physics* 50 (3), March 1979, describes an optical marking process based on diffusion in a dye-polymer system.

The prior art optical storage systems have one overriding disadvantage—prior art optical media is not erasable. As a result, optical storage technology has found little application in computer technology, which requires both read, write and erase functions.

High speed solid state optoelectronic switches are currently being studied and developed for a variety of signal processing applications, including mixing, synchronous detection, analog to digital conversion and sampling. In addition, there is also considerable interest in developing integrated optoelectronic devices (IOED) for use in high speed circuits. Combined with a modulated laser, optoelectronic switches form a powerful group of integrated circuits for use in optical communications and computer technology. Such devices are currently made from highly resistive, photosensitive semiconductors which depend on the recombination of photo-generated carriers. The two basic types of semiconductor photodetectors are junction diodes and photoconductor detectors using materials such as InP and GaAs These prior art optoelectronic devices are difficult and costly to fabricate.

Two co-pending U.S. patent applications filed by R. S. Potember, T. O. Poehler and D. O. Cowan, disclose a class of organic charge transfer salts, such as CuTCNQ, which exhibits stable and reproducible switching between an equilibrium, or first state, and a second state, in the presence of an applied electrical field. These applications are: (1) "Current Controlled Bistable Electrical Organic Thin Film Switching Device (TCNQ)", filed Mar. 14, 1980, Ser. No. 130,400 now U.S. Pat. No. 4,371,883; and, (2) "Method of Fabricating a Current Control Bistable Electrical Organic Thin Film Switching Device, (TCNQ)", filed June 7, 1982, Ser. No. 385,523 now U.S. Pat. No. 4,507,672. More particularly, these applications disclose that the organic charge transfer salts will undergo a reversible electrochemical topotactic redox reaction in the presence of an applied electric field, thereby switching from a first state to a second state, and that a detectable impedance difference occurs between the equilibrium, or first state, and the second state. In specific, an electrical field is applied across a thin film of CuTCNQ, or an equivalent organic charge transfer salt. When the applied electrical field exceeds a threshold value the impedance across the thin organic film will drop from a relatively high impedance to a relatively low impedance. The application further discloses that both bistable and threshold switching are possible.

Two papers written by R. S. Potember et al report that when the organic film is electrically switched, the second state has different optical properties from the equilibrium or first state; (1) "The Vibrational and X-ray Photoelectron Spectra of Semiconducting Copper-TCNQ Films" *Chemica Scripta,* Vol. 17, 219-221 (1981); and (2) "Electrical Switching and Memory Phenomena in Semiconducting Organic Thin Films" *American Chemical Society Symposium Series* No. 184 (1982). The above articles describe infrared spectroscopic means and reference well known Raman spectroscopic techniques (S. Matsuzaki et al, "Raman Spectra of Conducting TCNQ Salts" *Solid State Communications,* Vol. 33, pp. 403–405, 1980) for determining if the CuTCNQ film, switched by an AC or DC electric field is in the first or second state. Follow-up work reported by E. I. Kamitsos et al (cited below) used Raman spectroscopic techniques to verify the electrochemical charge transfer equation described in the above-referenced articles which causes the CuTCNQ salt to switch from the first to second state: "Raman Study of the Mechanism of Electrical Switching in CuTCNQ films" *Solid State Communications,* Vol. 42, No. 8, pp. 561-565 (1982). The above cited Potember et al, Matsuzaki et al and Kamitsos et al papers point out that spectroscopic means can be used to discern whether an area of CuTCNQ switched by an applied electrical field is in the first or second state.

However, neither these papers nor the previously mentioned pending U.S. applications specifically address the use of an optical frequency beam to switch the charge transfer salts, thereby providing optoelectronic switching and an optical memory storage capability. In addition, the above-referenced papers do not specifically apply spectroscopic analysis as a means to "read" whether a part of the organic charge transfer salt is in the first or second state. Further, the above articles and applications do not disclose the use of optical switching and spectroscopic analysis as a means to optically store and retrieve information.

SUMMARY OF THE INVENTION

The present inventors recognized the limitations in prior art optoelectronic switches and optical memory devices and have invented improved devices which use organic charge transfer salts as the switching and storing media. The present inventors discovered that organic charge transfer salts, such as CuTCNQ, can be switched by optical radiation, and that spectoscopic means and impedance measuring means can be used to determine if the charge transfer salt is in the first, equilibrium state, or in its second state.

The optically illuminated area undergoes an electrochemical topotactic redox reaction which causes a charge transfer between the organic electron acceptor and the donor. When switching occurs, analysis of the oxidation state of electron acceptor moiety shows that it is discernibly different in the second state from what it had been in the first state. It is believed that an optical electromagnetic field effect causes the bonds between the organic electron acceptor and the donor to break, allowing a charge to transfer from the donor to the organic electron acceptor. Thus, the optical field produces an electrochemical topotactic redox reaction which causes the organic charge transfer salt to switch from a first state to a second state.

A spectroscopic means and/or an impedance responsive means are used to determine if an area of the organic charge transfer salt is in the first or second state. The first state is characterized by a relatively high impedance and the second state is characterized by a low impedance. The optical spectrum of the organic charge transfer salt shows that a substantial amount of the organic electron acceptor moiety has a higher oxidation level in the second state than appeared in the first state. As an example, CuTCNQ contains a substantial amount of optically detectable neutral TCNQ molecules (TCNQ°) in the second state; whereas, in the first state substantially all of the TCNQ moiety is in a reduced state (TCNQ⁻).

Accordingly, it is one object of the present invention to provide an erasable optical memory using organic charge transfer salts, such as CuTCNQ, for the storage medium. The applicants discovered that when applied radiation exceeds a first threshold, the organic charge transfer salt will switch to the second state and when the beam is removed the organic charge transfer salt will return to the first state. Applicants discovered that when optical radiation is increased further to a second threshold, the organic charge transfer salt will switch to the second state and will not readily return to the equilibrium or first state. Applicants further discovered that the application of heat energy, either generated by black body radiation or optical means, causes the organic charge transfer salt to return back to the first or equilibrium state. The particular organic charge transfer salt used, the duration of illumination, and the size of illuminated area, all affect the intensity of light required to reach the first or second thresholds. Therefore, the optical memory contemplated in accordance with this invention generally comprises: a film of organic charge transfer salt; an optical write beam which is directed to illuminated one location of a plurality of locations on the surface of the organic charge transfer salt and causes the illuminated area to switch to the second state; a spectoscopic means for analyzing one of a plurality of locations and for determining if said analyzed location is in the first or second state; and, a thermal erase means for causing at least one of said plurality of locations to return to the first state.

It is another object of the invention to provide an optical media which can be read by the unaided human eye. Applicants discovered that an increase in intensity or duration of the optical illumination will cause the organic charge transfer salt in the illuminated area to change color. It is observed that the charge transfer salt in the second state will appear similar in color to the organic electron acceptor moiety in its neutral state. For example, CuTCNQ in the first state appears blue/black, and in a second state appears yellow (for increased illumination intensity and duration) which is similar to neutral TCNQ which also is yellow in color. It is an additional object of the invention to provide a means for erasing the visible markings generated by the optical beam by use of a thermal erase means. The thermal erase means reverses the electrochemical topotactic redox reaction causing the organic charge transfer salt to return to the first state.

It is another object of the invention to provide an optoelectronic switch which uses an organic charge transfer salt as the switching means. Applicants discovered that the impedance of the organic charge transfer salt changes from high to low when the illumination intensity exceeds a certain threshold (threshold switching). Applicants also discovered that the illuminated area will not readily return to the first state if the intensity of illumination exceeds a second threshold (bistable switching). The optoelectronic switch contemplated in accordance with the present invention generally comprises: a thin film of organic charge transfer salt deposited on a conductive substrate; a semitransparent conducting film formed over at least a portion of the organic charge transfer salt and allowing passage of optical radiation to the organic salt; a first electrode attached to the conductive substrate; and, a second electrode attached to the semitransparent film. The impedance across the first and second electrodes will be switched from high to low when the organic charge transfer salt is illuminated at the appropriate optical intensity.

It is another object of the invention to provide an optoelectronic switch which uses organic charge transfer salts as the switching means and which can be biased by an electric voltage. By placing a biasing voltage across the first and second electrodes, as defined above, the intensity of light needed to trigger the organic charge transfer salt from its first to second state can be adjusted. It is also the object of the present invention to provide a bistable switch which can be switched back to the first state by reducing the biasing voltage.

Another object of the invention to provide an analog to digital optoelectronic switch. In the present invention incident light must exceed a threshold value before the device can switch between the two well defined impedance states. In this manner, the optoelectronic switch will convert an analog optical signal into a discrete or digital electrical signal.

While several features of the present invention relate to optoelectronic switches and optical memory devices, it is to be understood that the above-mentioned optical switching function of the organic charged transfer salts can have application in other optical devices and optically sensitive apparatus. The above-mentioned objectives, as well as other objectives and advantages of the present invention will become readily apparent after reading the ensuing description of several non-limiting illustrative embodiments and viewing the accompanying drawings.

BRIEF DESCRIPTION OF THE DRAWINGS

FIG. 5 is a table showing the color change when avarious organic charge transfer salts switch from the first to second states due to an intense or long duration optical beam.

FIG. 6 is a graph showing impedance change as TCNQ film is optically switched from a first to a second state.

FIG. 8 is a generalized schematic of the optic storage media.

DETAILED DESCRIPTION OF THE PREFERRED EMBODIMENT

Figure 1:
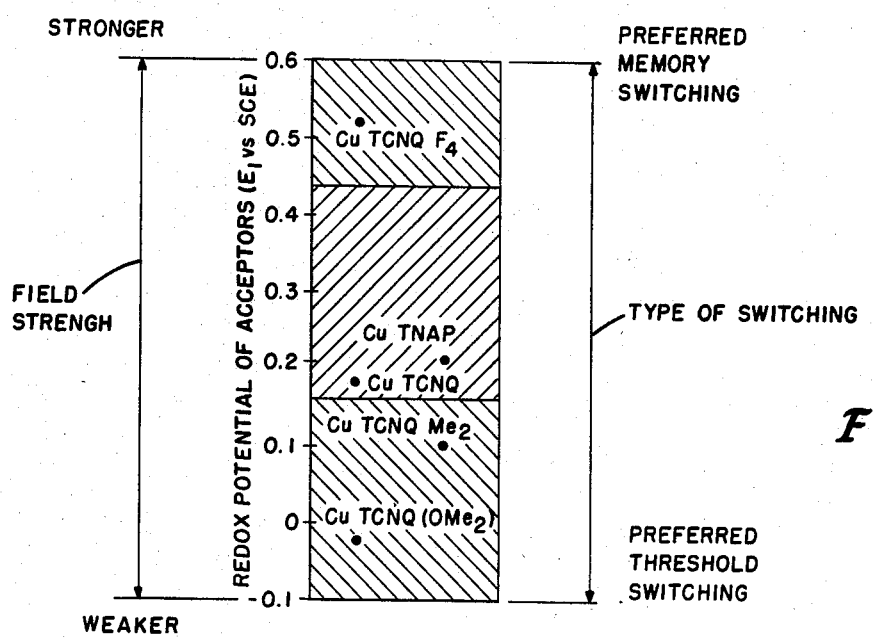
FIG. 1 is a graph illustrating the type of switching which occurs as a function of optical beam intensity and the REDOX potential of the organic charge transfer salt.

The basic electrochemical topotactic redox reaction which occurs when an organic charge transfer salt, in this case CuTCNQ, is illuminated with a beam of optical energy and switched from a first to a second state is shown below:

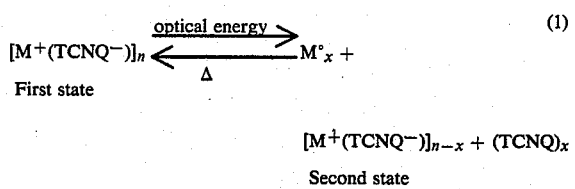

$$[M^+(TCNQ^-)]_n \xrightleftharpoons[\Delta]{\text{optical energy}} M^\circ{}_x + [M^+(TCNQ^-)]_{n-x} + (TCNQ)_x$$

First state

Second state

It is believe that switching occurs because the optical frequency electromagnetic field strength causes the bonds between the organic electron acceptor (in this case TCNQ) and the donor (represented by M) to break, allowing a charge to transfer from the donor to the organic electron acceptor. The foregoing equation (1) clearly shows the change in charge distribution as the organic salt switches from the first to second state. In the first, or equilibrium state, the organic electron acceptor moiety is found almost exclusively in the reduced form ($TCNQ^-$). However, in the second state the organic electron acceptor moiety is found in both its reduced ($TCNQ^-$) and the neutral $TCNQ^\circ$ forms. As the intensity and duration of the incident optical radiation increases the number of neutral molecules of the organic electron acceptor ($TCNQ^\circ$) is increased. The equation (1) also shows that the reaction is reversible by heat energy. It is to be understood that the equation (1) shows TCNQ as the organic electron acceptor only by way of example. Applicants will identify, later in this application, various organic charge transfer salts containing different donor and organic electron acceptor moieties which will switch in the presence of optical radiation.

The organic charge transfer salt will behave as a threshold or memory switch depending on the incident optical energy. The incident optical energy must reach a first threshold level before the organic charge transfer salt switches from the first to second states. The first threshold intensity level is determined by (1) the choice of the organic charge transfer salt; (2) the size of the incident beam; (3) the duration of the applied optical field; and (4) the thickness of the organic salt film. The stronger the bonding energy between the organic electron acceptor and the donor, the greater the threshold level needed to to initiate switching from the first to second states. For threshold switching the illuminated area rapidly returns to the first state after the optical beam is removed. Experimentation with CuTCNQ indicates that the film switch in less than 4 ns from the first to second state when illuminated by an argon laser beam. The illuminated area returns back to the first state once the beam is removed in an equivalent time period.

However, for memory switching the intensity and duration of the optical beam is increased and the illuminated area is reluctant to return to the thermodynamically stable first state after the optical beam is removed. In most cases, ambient thermal energy is insufficient to rapidly reverse the electrochemical reaction back to the first state and a substantial period of time is necessary before the illuminated area can return to the first state. Therefore, a memory media is produced which has two stable states: a first state (or a logical "0"); and, a second or switch state (or logical "1"). The length of time memory can be retained depends on: (1) the selection of organic charge transfer salt; (2) the diameter of the incident beam; (3) the duration and intensity of the applied optical field; and (4) the thickness of the organic salt film.

The memory switch can be erased, or returned to the first state, by applying heat to that area of the organic charge transfer salt. The applied heat can be generated by electrical or optical means. In the preferred embodiment, described later, the applicants used heat generated by a $CO_2$ laser to return an area on the memory media to its first state.

FIG. 1 is a graph illustrating the types of type of switching which occurs as a function of optical beam intensity and as a function of the bonding energy (i.e., REDOX potential of acceptors for various organic charge transfer salts). A first optical threshold level must be reached before an area can be switched and react as a "threshold switch". As the intensity increases, for a particular organic charge transfer salt, the switching will change from "threshold switching" to "memory switching". It is to be understood that the graph in FIG. 1 is for illustrative purposes only and that the threshold values can depend on a variety of factors as discussed earlier in this application. It will also be noted that the frequency of the optical beam can be chosen from the ultraviolet, visible and/or infrared regions of the electromagnetic spectrum.

As has been outlined previously in this application, spectoscopic means can be used to determine if the location on the surface of an organic charge transfer salt is in the first or second state. Both infrared spectoscopic means and Raman spectoscopic means can be used to identify if a location on the organic charge transfer salt is in the first or second state. Although applicants' preferred embodiments uses Raman spectoscopic techniques or a technique which analyzes a particular narrow band of laser light reflected from the organic charge transfer salt, described hereinafter, it is to be understood that any other well known spectoscopic or similar technique can be used which has the capability of identifying a change in oxidation state of the organic electron acceptor moiety or a change in the reduction state of the donor moiety (i.e., either Electron Spectrum Chemical Analysis (ESCA), X-ray photoelectron spectroscopy (XPS), or Raman or infrared spectographic means can detect the change oxidation state of the donor and/or the organic electron moieties.)

Figure 2A:
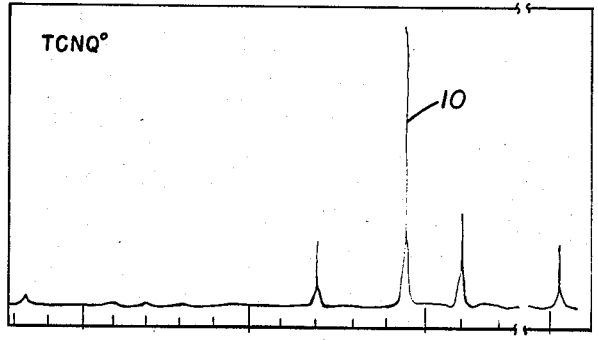
FIGS. 2a, 2b and 2c are graphs showing the spectral bands for neutral TCNQ, CUTCNQ in the first state and CUTCNQ in the second state respectively.
Figure 2B:
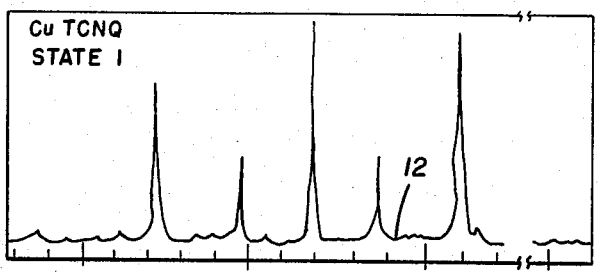
Figure 2C:
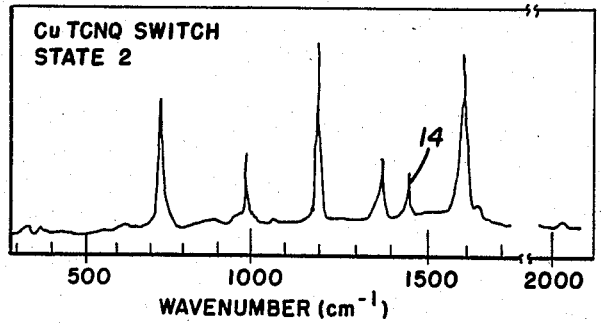

FIG. 2 shows Raman spectral bands for the organic charge transfer salt CuTCNQ: FIG. 2a shows the spectral bands for neutral TCNQ (e.g., TCNQ°); FIG. 2b shows the spectral bands for CuTCNQ in the first state where essentially all the organic electron acceptor moiety is in a reduced state (e.g., TCNQ⁻); FIG. 2c shows the spectral band for CuTNCQ in the second or switch state where the organic electron acceptor moiety is in both the reduced (TCNQ⁻) and neutral oxidation states (TCNQ°). The Raman spectral bands are sensitive to the charge on the organic electron acceptor moiety, which in our example is the TCNQ moiety. Spectral bands $\nu_2$, $\nu_4$, $\nu_6$ and $\nu_7$ are strongly affected by the electronic structure of TCNQ. The $\nu_4$ mode which represents "C=C" stretching appears at a frequency of 1451 cm$^{-1}$ for neutral TCNQ (e.g., TCNQ°). In FIG. 2a, the 1451 cm$^{-1}$ spectral band 10 for neutral TCNQ (e.g., TCNQ°) shows a strong reading associated with the $\nu_4$ mode. In FIG. 2b, which represents the organic charge transfer salt CuTCNQ and its first state, the TCNQ $\nu_4$ mode does not appear in the 1451 cm$^{-1}$ spectral band 12. This indicates that in its first state substantially all of the TCNQ moiety is in the reduced or TCNQ⁻ form. However, FIG. 2c which represents the organic charge transfer salt CuTCNQ in its switched or second state, shows the presence of the TCNQ $\nu_4$ mode in the 1451 cm$^{-1}$ spectral band 14. Thus, the second state has an optical spectrum which is characterized by the appearance of a strong band at 1451 cm$^{-1}$ which in turn is evidence of the presence of neutral TCNQ (e.g., TCNQ°).

The spectral bands shown in FIGS. 2 a, b and c verify the electrochemical charge transfer equation (1), described above, and provides one with a simple means for optically determining if the CuTCNQ organic salt is in the first or second state. When CuTCNQ is used as the organic charge transfer salt one need only analyze the 1451 cm⁻ spectral band to determine if the organic salt is in the first or second state. If the organic charge transfer salt is in the first state a low spectral intensity will appear in the 1451 cm$^{-1}$ band; if the organic charge transfer salt is in the second state, the spectral intensity at 1451 cm$^{-1}$ is high. It is to be understood that other bands might be chosen to analyze the states of CuTCNQ and that if other organic charge transfer salts are used other spectral bands would be used to perform this analysis. However, the principle is the same, one uses spectroscopic means to observe the organic electron acceptor's change in charge distribution as the organic charge transfer salt switches from to the first to second state. One then chooses a spectral band which shows a a Raman mode which appears in the first state but not the second state. Well known techniques are then used to design a spectroscopic means and to measure the intensity in the selected spectral band.

Figure 3:
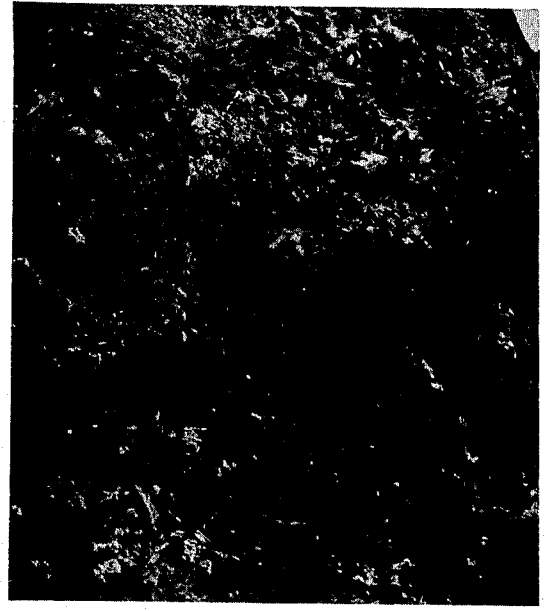
FIG. 3 is a black and white electron microscope photograph showing a microscopic region of neutral TCNQ formed when an optical beam of selected intensity or selected duration writes on a AgTCNQ film.
Figure 4:
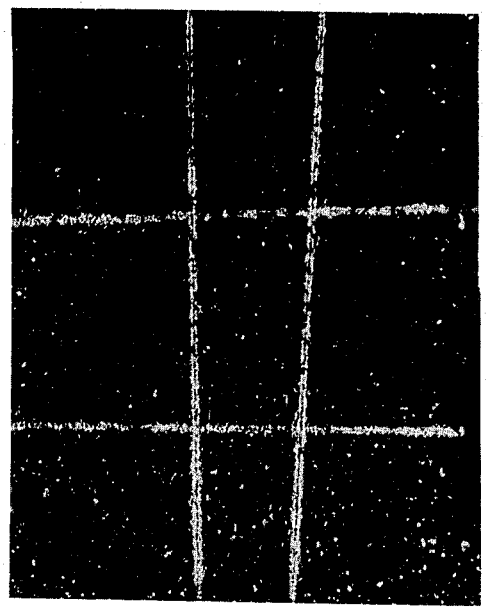
FIG. 4 is a black and white photograph showing the high contrast pattern which is formed when a laser scans across a AgTCNQ film.

The change in optical spectrum as the organic charge transfer salt switches from the first to second states can also be observed directly with the unaided human eye. When the optical beam is intensified or the duration is increased, lines or patterns can be generated on the surface of the organic charge transfer salt film as the beam scans across the surface. These patterns are visible optically as a result of the formation of microscopic regions of the neutral organic electronic acceptor. FIG. 3 shows a high contrast pattern as the optical beam is scanned across AgTCNQ organic charge transfer film using known scanning measures. By sweeping a modulated laser beam across the film surface it has been found that millisecond exposures are sufficient to write the type of lines showing FIG. 4. FIG. 5 is a table showing the color changes which occur as two typical organic charge transfer salts are switched from the first to second states. It can be generalized that the color of the second state closely resembles the color of the neutral organic electron acceptor moiety. For example, CuTCNQ in its second state is yellow, the same color as neutral molecules of TCNQ° (e.g., TCNQ°). Again, the color change verifies the equation described above and shows that neutral molecules of the organic electron acceptor are generated as the organic charge transfer salt is irradiated. It also has been found that applying heat to the surface reverses the electrochemical topotactic redox reaction which in turn "erases" the observable lines. The heat energy can be applied directly to the film surface by use of CO$_2$ laser focused to generate heat.

In addition to measuring the transition between the two states of the organic charge transfer salt using spectroscopic means, one can measure the changes in electrical impedance. FIG. 6 shows the electrical switching characteristics of an AgTCNQ organic charge transfer salt when it is illuminated by an argon ion laser beam. The impedance of the first state is high as shown by the I-V curve 16. When the AgTCNQ organic charge transfer salt is switched to second state, the impedance becomes low as shown by the I-V curve 18. Known electronic circuitry can be used as a means to detect the high or low impedance levels.

Applicants have discovered a number of organic charge transfer salts which will switch from the first to second states, as above-described, in the presence of energy from an optical field. Applicants have found that various TCNQ derivatives, when complexed with a metal donor, will form an organic charge transfer salt capable of optical memory and/or switching. Examples of these TCNQ derivatives are shown in the following table:

| TCNQ (OMe) | TCNQ IMe |
|---|---|
| TCNQ (OMe)$_2$ | TCNQI |

| -continued | |
|---|---|
| TCNQ (OMe) (OEt) | TCNQ(OMe)(OCH$_3$)2 |
| TCNQ (OMe) (0-i-Pr) | TCNQ (CN)2 |
| TCNQ (OMe) (0-i-Bu) | TCNQ (Me) |
| TCNQ (0-i-C$_2$H$_5$) | TCNQ (Et) |
| TCNQ (OEt) (SMe) | TCNQ (i-Pr) |
| TCNQ Cl | TCNQ (i-Pr)2 |
| TCNQ Br | TCNQ (i-Pr) |
| TCNQ ClMe | TCNQ (i-Pr)2 |
| TCNQ Br Me | |

Applicants have further found that if an organic electron acceptor containing at least one cyanomethylene functional group is complexed with a donor moiety to form an organic salt, the organic salt will have memory and switching capabilities. Also Applicants have found that if an organic electron acceptor contains at least one quinolene unit is complexed with a donor moiety to form an organic salt, that organic salt will also have memory and switch capabilities. In specific, if an organic salt is formed from the following organic electron acceptors, the organic salt will be capable of optical memory and/or switching: tetracyanoquinodimethane (TCNQ), tetracyanonapthoquinodimethane (TNAP), tetracyanoethylene (TCNE), and 2, 3 dichloro-5,6 dicyano-1, 4 benzoquinone (DDQ), hexacyanobutalene (HCBD), and 11, 11, 12, 12-tetracyano-1.4 naphthoquinodimethane (bento TCNQ), and 2,5-bis (dicyanomethalene)-2, 5-dihydrothiophene, and 2,5-bis (dicyanomethalene)-2, 5-selenophene, and thiophene-(T)-TCNQ, and (selenophene-(Se)-TCNQ) and tetracyano-quinoquinazolinoquinazoline (TCQQ) and hexacyanotrimethylene cyclopropane (HMCTMCP) and 2,4-bis (dicyanomethylene)-1,3-dithietan (BDDT), and any of the TCNQ derivatives shown in the above table.

Applicants have discovered that if the following metals are complexed with the above-referenced organic electron acceptor to form an organic salt, the organic salt will switch optically: copper, silver, lead, nickel, lithium, sodium, potassium, barium, chrome, molydenum, tungsten, cobalt, iron, antimony, cesium and mangnesium. In addition, the following organic substances can also act as donors, and if complexed with an organic electron acceptor to form an organic salt, the organic salt will be capable of optical memory and/or switching: tetrathio ethelenes, dithiodynaminoethylenes, dithyodisalinoethyelenes, tetraminoethylenes, azenes, aromatic hydrocyclics. It is to be understood that other organic transfer salts formed with organic electron acceptors having either cyanomethylene functional groups or quinolene units and other organic salts having similar characteristics, may be found with switch from the above-referenced first state to second state in the presence optical radiation.

Figure 7:
FIG. 7 is a black and white electron microscope photograph showing the polycrystalline structure of the organic charge transfer salt.

One method of forming the organic charge transfer salt is described in detail in the previously mentioned U.S. patent application ("Method of Fabricating a Current Control Bistable Electrical Organic Thin Film Switch Device (TCNQ)", filed June 7, 1982, Ser. No. 385,523) which is incorporated herein by reference. The organic charge transfer salt is formed by reacting the donor in a solution of the organic electron acceptor. For example, a metal substrate such as copper can be dipped in a TCNQ°-CH$_3$CN solution until the desired film thickness of the CuTCNQ forms on the metal substrate. Applicants recommend that the organic charge transfer salt be grown to a film thickness of 5 microns. (It has been mentioned previously that the film thickness affects the required intensity of the optical thresholds). FIG. 7 contains a photograph showing the polycrystalline structure of the organic charge transfer salt CuTCNQ formed by this method such molecular crystalline structure allows electrical conductivity and can be used for switching or optical memory. Other methods such as vapor deposition of the copper film on a substrate and subsequent vapor deposition of TCNQ forming a complex reaction, or other well known chemical methods may be used to form CuTCNQ salts which may be used for optical memory. It is also to be understood that organic charge transfer salts other than CuTCNQ can be fabricated in this manner. It has also been observed that the fabrication of electronic circuits using organic charge transfer salts can be simplified because in the first or equilibrium state the salt is insoluble in organic solvents whereas in the second state it is soluble in orgnic solvents.

FIG. 8 is a schematic diagram of an optical storage system using an organic charge transfer salt as a storage media. The organic charge transfer salt 20 is deposited on a supporting base material 22. As mentioned previously, Applicants have found good results with an organic charge transfer salt film thickness of 5 microns. An optional transparent protective coating 24 may be deposited on the surface of the organic charge transfer salt film 20. An optical write beam 26 is focused to a specific location 28 on the surface of the organic charge transfer film 20. The optical beam can be a high intensity light source or a laser source such as an argon or CO$_2$ laser focused to generate a field on the film surface. As mentioned previously, the intensity of the beam will cause the following result: (1) if the beam intensity is below the first threshold value, as defined previously, the organic charge transfer salt at location 28 will stay in the first state; (2) if the beam intensity is increased above the first threshold, location 28 will switch to the second state, but will switch back to the first state when the optical beam is removed; (3) if the beam intensity and/or duration is increased further, the organic charge transfer salt at location 28 will switch to the second state for an indefinite period of time; and (4) if the optical beam width, intensity and/or duration is increased still further, a visible color change will appear at location 28. As mentioned previously, the optical intensity necessary to produce the above changes depends on the choice of the organic charge transfer salt, film thickness, and the area and intensity of the incident optical beam. For a memory system, an optical beam 26 with sufficient intensity can be directed by well known optical means to other locations on the surface of the organic charge transfer salt 20, and can switch such other locations from the first to second state. By turning the beam "on" or "off" at a specific location a "1" or a "0" logical state can be set in the optical storage media. Alternatively, if a higher optical intensity or longer duration is used, the optical beam 26 can be directed by well known optical means to "draw" a visible pattern on the organic charge transfer salt 20.

Figure 9:
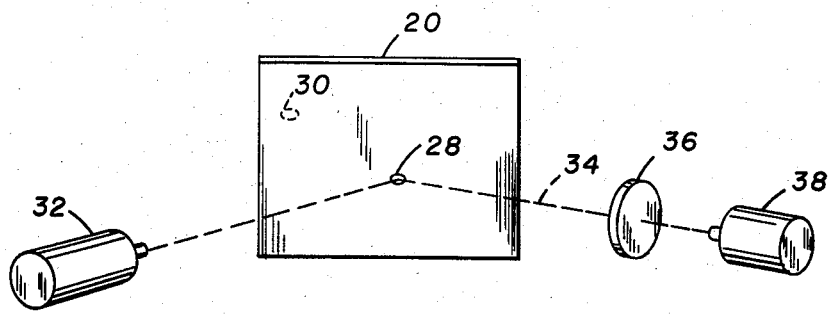
FIG. 9 is a generalized schematic of the spectroscopic read means.

Once data has been stored on the organic charge transfer salt storage media, a spectroscopic means can be used to determine if a particular location on the organic film is in its first or second state. FIG. 9 is a schematic of the spectroscopic means and shows locations 28 and 30 which are two of a possible plurality of storage locations containing data. A light source or a reading optical beam 32 is directed to illuminate one of the locations 28 with an intensity well below the first intensity threshold so that the state at location 28 is not disturbed. The light source 32 for Raman spectroscopic analysis should be a monochromatic source and Applicants suggest the use of laser source. Reflected light 34 from the selected location on the film surface 28 is collected and filtered by the optical filter 36 and then passed to a means for measuring the spectral intensity 38. As previously mentioned, optical filter 36 would only pass the desired spectral band, selected in the manner previously described. The spectral measurement means 38 would indicate if the reflected beam 34 passed through filter 36 had a high or low amplitude. This in turn would indicate if location 28 was in the first or second state. The reading optical beam 32 can be directed by well known optical means to each of a plurality of locations (i.e., 28, 30) on the surface of the organic charge transfer salt 20 to determine if that particular location is in the first or second state, that is to say, if that particular location is storing a logical "1" or a logical "0".

Figure 10:
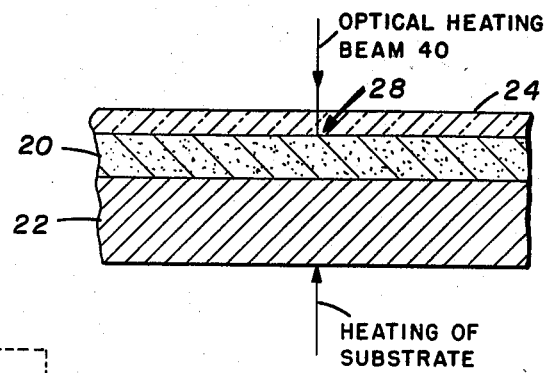
FIG. 10 is a generated schematic of the thermal erase means.

FIG. 10 is a schematic showing the thermal erase means which is used to reverse the electrochemical topotactic reduction reaction and cause at least one of the plurality of locations on the surface of the organic charge transfer salt 20 to return to the first state. FIG. 10 shows two alternate embodiments for the thermal erase means. The first embodiment uses thermal radiation from an optical beam 40 focused on the location 28 to generate sufficient heat to switch the area back to the first state. Applicants have found that the a $CO_2$ laser, with an intensity below the first threshold, can be focused on location 28 for a time period long enough to generate sufficient thermal energy to switch that location back to the first state. The optical heating beam 40 can be directed by well known optical means to erase other locations on the organic charge transfer salt surface 20. An alternate embodiment uses an electrical heating element 42, located below substrate 22, to generate sufficient thermal energy to "erase" a portion of the organic charge transfer salt film 20.

In an alternative embodiment, the optical write beam 26, optical read beam 32, and the optical heating beam 40, can be generated by a single laser source by varying the intensity and duration of the illuminating beam. It is within the contemplation of the applicants that other well known means can be used to generate the desired optical write, read, an erase beams and to direct such beams to the desired location on the organic charge transfer salt surface.

Figure 11:
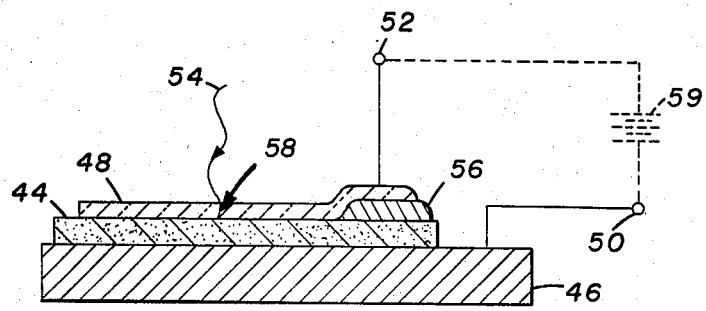
FIG. 11 is a generalized schematic of an optoelectronic switch using an organic charge transfer salt as the switching mechanism.

FIG. 11 is a schematic representation of an optoelectronic switch which uses an organic charge transfer salt as the switching mechanism. The optoelectronic switch generally comprises: a thin film of organic charge transfer salt 44 deposited on a conductive substrate 46; a semitransparent conducting film 48 formed over at least a portion of the organic film 44; a first electrode 50 attached to said conductive substrate 46; and, a second electrode 52 attached to said semitransparent conducting film 48. As previously mentioned, the organic charge transfer salt film 44 thickness can be approximately 5 microns. The semitransparent conducting film 48 can be made from metal such as aluminum or chromium and can be evaporated or sputtered directly on the organic film 44 to a thickness that permits partial transmission of the optical radiation 54. Optical insulating material 56 can be used to insulate the organic film 44 when the second electrode 52 is connected to the semitransparent conducting film 48. In operation, when the organic beam 54 exceeds the first threshold, as defined previously, the surface area 58 illuminated by the beam will switch to the second state and the electrical impedance as measured across the two electrodes, 50, 52, will jump from a high impedance to a low impedance. When beam 54 is removed or when the intensity drops below the first threshold value, the illuminated area 58 will return to the first state (e.g., threshold switching). However, if the intensity and/or duration of the optical beam 54 is increased, the optoelectronic switch will be switched into the second state for an indefinite period of time (e.g., bistable switching). The period the switch will stay in a second state or the low impedance state, depends on: (1) the choice of the organic charge transfer salt; (2) the thickness of the film; (3) the duration and intensity of the illuminating optical beam; (4) the area of the illuminating beam; and (5) the ambient or applied thermal energy. The bistable switch, as described above, can be returned to the first state by the application of heat energy by methods or their equivalents, discussed earlier in this application.

Figure 12:
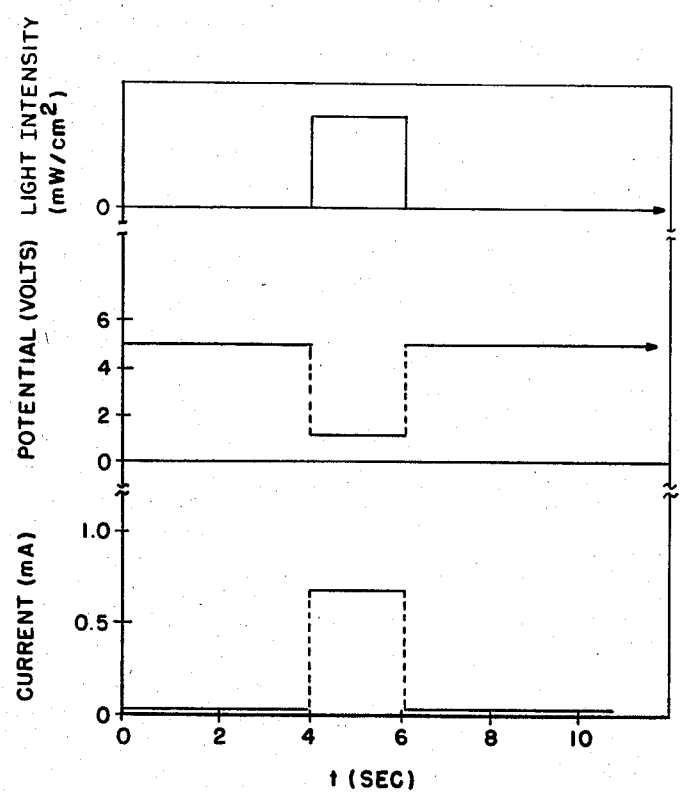
FIG. 12 is a graph showing the change in current and voltage when an AgTCNQ switch is biased with 5 volts DC and switched by optical radiation.

FIGS. 6 and 12 show the electrical characteristics of a typical optoelectronic switch (see FIG. 11) fabricated using an AgTCNQ optical charge transfer salt film 44, a silver conducting substrate 46, and a semitransparent aluminum conducting film 48. The AgTCNQ film thickness was approximately 5 microns. The organic film 44 was switched using 488 nm radiation at an intensity of $10^4$ V/cm produced by an argon laser. The beam intensity was sufficient to exceed the first threshold and produce a threshold switch. When irradiated, the AgTCNQ film switched from the first to second state in 4 ns. When the optical beam was removed the AgTCNQ film returned to the first state in an equivalent time period. A DC biasing voltage 59 of 5 volts was connected across the two electrodes (50, 52) (see FIG. 11) such that the organic film remained in the first, high impedance state just below the threshold for electrical switching (see I-V curve 16 in FIG. 6). Application of the argon laser beam causes the organic film to rapidly change to the second, low impedance state (see I-V curve 18 in FIG. 6). FIG. 12 shows the electrical response of the above-mentioned AgTCNQ switch. It can be seen that when the optical beam exceeds the first threshold level, the voltage potential across electrodes 50, 52 (see FIG. 11) drops and the current across the electrodes rises rapidly.

Several special features of the optoelectronic switching mechanism need to be pointed out. First, the optical beam's intensity must exceed the first threshold, as defined previously, before the device switches. In this manner, an analog optical signal can be converted into a discrete digital electrical signal. Secondly, the DC biasing voltage can be used to adjust the beam intensity necessary to switch the organic charge transfer salt. As noted previously, the organic charge transfer salt will switch from the first to second states due to either an applied electric field, or an applied optical field. Therefore, by applying DC biasing voltage, the required optical intensity can be reduced. The applied DC voltage and optical beam add to generate the electrical field which causes the organic charge transfer salt to switch from the first to the second states. It is also possible in this manner to switch a bistable optoelectronic switch back to the first state by independently reducing the biasing voltage. It is within the contemplation of the inventors that both the optical beam and the DC voltage can be used in various combinations to switch the optical charge transfer salt.

Obviously many modifications and variations of the present invention are possible in light of the above teachings. It is therefore to be understood that within the scope of the appended claims the invention may practiced otherwise than as specifically described.

What is claimed and desired to be secured by Letters Patent of the United States is:

1. An optically sensitive apparatus comprising:
   an organic charge transfer salt formed from a donor complexed with an organic electron acceptor; and,
   a source of electromagnetic energy at optical frequency, said electromagnetic energy illuminating an area on said organic electron charge transfer salt and causing said illuminated area to undergo an electrochemical topotactic redox reaction which causes a charge transfer between said organic electron acceptor and said donor, thereby switching said illuminated area from an equilibrium state to a second state, said second state having a detectably different charge distribution from said equilibrium state.

2. The apparatus of claim 1 wherein said second state has a detectably different optical spectrum from said equilibrium.

3. The apparatus of claim 2 further comprising:
   a spectroscopic means, focused on a portion of said organic charge transfer salt, for determining whether said portion is in said equilibrium state or said second state.

4. The apparatus of claim 3 wherein said spectroscopic means detects the presence of neutral molecules of said organic electron acceptor, said second state having more neutral molecules of said electron acceptor then said equilibrium state.

5. The apparatus of claim 3 wherein said spectroscopic means measures the magnitude of at least one spectral band associated with neutral molecules of said organic electron acceptor, said at least one spectral band having a greater magnitude in said second state than said equilibrium state.

6. The apparatus of claim 3 wherein said spectroscopic means detects the change in oxidation state of said organic electron acceptor, thereby detecting whether said portion is in said equilibrium state or said second state.

7. The apparatus as in claim 2, wherein said donor is copper, said organic electron acceptor is TCNQ, and spectral analysis shows substantially more neutral molecules of TCNQ in said second than said equilibrium state.

8. The apparatus as in claim 2, wherein said donor is silver, said organic electron acceptor is TCNQ, and spectral analysis shows substantially more neutral molecules of TCNQ in said second than said equilibrium state.

9. The apparatus of claim 1 wherein said second state has a detectably different color from said equilibrium state.

10. The apparatus of claim 7 wherein said color difference between said first and said second state is perceivable by the unaided eye.

11. The apparatus as in claim 9 wherein said donor is silver (Ag), said organic electron acceptor is TCNQ, said equilibrium state is purple and said second state is yellow.

12. The apparatus as in claim 9 wherein said donor is copper, said organic electron acceptor is TCNQ, said equilibrium state is blue/black and said second state is yellow.

13. The apparatus as in claim 9 wherein the color of said second state is substantially similar to the color of neutral molecules of said organic electron acceptor.

14. The apparatus of claim 9 wherein said electrochemical reaction is irreversible and said illuminated area is permanently switched to said second state.

15. The apparatus of claim 1 wherein said second state has a detectably different electrical impedance from said equilibrium.

16. The apparatus as in claim 15, wherein said donor is copper, said organic electron acceptor is TCNQ, and said second state has a lower impedance than said equilibrium state.

17. The apparatus as in claim 15, wherein said donor is silver, said organic electron acceptor is TCNQ, and said second state has a lower impedance than said equilibrium state.

18. The apparatus of claim 15, further comprising:
    a means for detecting the impedance across a portion of said organic charge transfer salt and for determining if said portion is in said first or said second state.

19. The apparatus of claim 18 wherein said means for detecting impedance detects a lower impedance for said second state than for said equilibrium state.

20. The apparatus of claim 2, 9 or 15 further includes a source of thermal energy for reversing said electrochemical topotactic redox reaction to cause a charge to transfer back from said donor to said organic electron acceptor, thereby returning said illuminated area to said equilibrium state.

21. The apparatus of claim 1 wherein said equilibrium state is insoluble in organic solvents and said second state is soluble in organic solvents.

22. The apparatus of claim 2, 7, 15 or 21 wherein said organic electron acceptor further comprises an organic material incorporating at least one cyanomethylene functional group and having the chemical properties which permit formation of an organic salt when complexed with said donor.

23. The apparatus of claim 2, 7, 15 or 21 wherein said organic electron acceptor further comprises an organic material incorporating at least one quinolene unit and having the chemical properties which permit formation of an organic salt when complexed with said donor.

24. The apparatus of claim 2, 7, 15 or 21 wherein said organic electron acceptor is a material selected from the group consisting of tetracyanoquinodimethane (TCNQ), tetracyanonapthoquinodimethane (TNAP), tetracyanoethylene (TCNE), and 2, 3 dichloro-5,6 dicyano-1, 4 benzoquinone (DDQ), hexacyanobutalene (HCBD), and 11, 11, 12, 12-tetracyano-1.4 naphthoquinodimethane (bento TCNQ), and 2,5-bis (dicyanomethalene)-2, 5-dihydrothiophene, and 2,5-bis (dicyanomethalene)-2, 5-selenophene, and thiophene-(T)-TCNQ, and (selenophene-(Se)-TCNQ) and tetracyano-quinoquinazolinoquinazoline (TCQQ) and hexacyanotrimethylene cyclopropane (HMCTMCP) and 2,4-bis (dicyanomethylene)-1,3-dithietan (BDDT), and any of the TCNQ derivatives defined by the notation:
    TCNQ(OMe)
    TCNQ(OMe)$_2$
    TCNQ(OMe)(OEt)

TCNQ(OMe)(O-i-Pr)
TCNQ(OMe)(O-i-Bu)
TCNQ(O-i-C$_2$H$_5$)
TCNQ(OEt)(SMe)
TCNQ Cl
TCNQ Br
TCNQ ClMe
TCNQ Br Me
TCNQ IMe
TCNQI
TCNQ(OMe)(OCH$_3$)2
TCNQ(CN)2
TCNQ(Me)
TCNQ(Et)
TCNQ(i-Pr)
TCNQ(i-Pr)2.

25. The apparatus of claim 2, 7, 15, or 21 wherein said organic electron acceptor is a material selected from the group consisting of tetracyanoquinodimethane (TCNQ) and any of the TCNQ derivations defined by the notation:
  TCNQ (OMe)
  TCNQ (OMe)$_2$
  TCNQ (OMe)(OEt)
  TCNQ Cl
  TCNQ Br
  TCNQ ClMe
  TCNQ Br Me
  TCNQ I Me
  TCNQ I
  TCNQ (CN)2
  TCNQ (Me)
  TCNQ (Et)
  TCNQ (i-Pr).

26. The apparatus of claim 2, 7, 15, or 21 wherein said donor is a metal and said metal is selected from the group consisting of copper, silver, lead, nickel, lithium, sodium, potassium, barium, chrome, molybdenum, tungsten, cobalt, iron, antimony, cesium, magnesium and having chemical properties which permit formation of an organic salt when complexed with said organic electron acceptor.

27. The apparatus of claim 2, 7, 15, or 21 wherein said donor is an organic material selected from the group consisting of tetrathioethelenes, dithiodynamino ethylenes, dithyodisalino etheylenes, tetramino ethylenes, azenes, aromatic hydromatic hydrocyclics and having chemical properties which permit formation of organic salt when complexed with said organic electron acceptor.

28. The apparatus of claim 25 wherein said donor is a metal and said metal is selected from the group consisting of copper and silver.

29. An optical memory comprising:
  a film of organic charge transfer salt formed from a donor complexed with an organic electron acceptor;
  an optical write beam, for illuminating selectively at least one of a plurality of locations on the surface of said organic charge transfer salt to cause an illuminated location to undergo an electrochemical topotactic redox reaction, further causing charge transfer between said organic electron acceptor and said donor, thereby switching said illuminated location from a first state to a second state, said first state having a different optical spectrum from said second state; and,
  a spectroscopic means for analyzing selectively the optical spectrum of at least one of said plurality of locations and for determining if an analyzed location is in said first or said second state.

30. The apparatus of claim 29 wherein said organic electron acceptor further comprises an organic material incorporating at least one cyanomethylene functional group and having the chemical properties which permit formation of an organic salt when complexed with said donor.

31. The apparatus of claim 29 wherein said organic electron acceptor further comprises an organic material incorporating at least one quinolene unit and having the chemical properties which permit formation of an organic salt when complexed with said donor.

32. The apparatus of claim 29 wherein said organic electron acceptor is a material selected from the group consisting of tetracyanoquinodimethane (TCNQ), tetracyanonapthoquinodimethane (TNAP), tetracyanoethylene (TCNE), and 2, 3 dichloro-5,6 dicyano-1, 4 benzoquinone (DDQ), hexacyanobutalene (HCBD), and 11, 11, 12, 12-tetracyano-1.4 naphthoquinodimethane (bento TCNQ), and 2,5-bis (dicyanomethalene)-2, 5-dihydrothiophene, and 2,5-bis (dicyanomethalene)-2, 5-selenophene, and thiophene-(T)-TCNQ, and (selenophene-(Se)-TCNQ) and tetracyanoquinoquinazolinoquinazoline (TCQQ) and hexacyanotrimethylene cyclopropane (HMCTMCP) and 2,4-bis (dicyanomethylene)-1,3-dithietan (BDDT), and any of the TCNQ derivatives defined by the notation:
  TCNQ(OMe)
  TCNQ(OMe)$_2$
  TCNQ(OMe)(OEt)
  TCNQ(OMe)(O-i-Pr)
  TCNQ(OMe)(O-i-Bu)
  TCNQ(O-i-C$_2$H$_5$)
  TCNQ(OEt)(SMe)
  TCNQ Cl
  TCNQ Br
  TCNQ ClMe
  TCNQ Br Me
  TCNQ IMe
  TCNQI
  TCNQ(OMe)(OCH$_3$)2
  TCNQ(CN)2
  TCNQ(Me)
  TCNQ(Et)
  TCNQ(i-Pr)
  TCNQ(i-Pr)2.

33. The apparatus of claim 29 wherein said donor is a metal and said metal was selected from the group consisting of copper, silver, lead, nickel, lithium, sodium, potassium, barium, chrome, molydenium, tungsten, cobalt, iron, antimony, cesium, magnesium, and having chemical properties which permit formation of an organic salt when complexed with said organic electron acceptor.

34. The apparatus of claim 29 wherein said donor is an organic material selected from the group consisting of tetrathioethylenes, dithiodynamino ethylenes, dithyodisalino ethylenes, tetramino ethylenes, azenes, aromatic hydrocarbons, and aromatic hydromatic hydrocyclics having the chemical properties which permit formation of an organic salt when complexed with said organic electron acceptor.

35. The apparatus as in claim 29 wherein said optical write beam has an intensity which permanently switches said selectively illuminated location to said second state.

36. The apparatus of claim 29 wherein said optical write beam has a first and a second intensity, said first intensity producing a reaction which causes said selectively illuminated location to switch from said first to said second state when illuminated, said second intensity producing an irreversible reaction which causes said location to switch from said first to said second state for an indefinite time after the optical write beam is no longer illuminating said location.

37. The apparatus as in claim 29 further comprising a means for directing said optical write beam to a selected location of said plurality of locations.

38. The apparatus as in claim 29 wherein said first state represents the storage of a logical "1", and wherein said second state represents the storage of a logical "0".

39. The apparatus as in claim 29 wherein said spectroscopic means detects the change in oxidation state of said organic electron acceptor, thereby detecting whether said location is in said first state or said second state.

40. The apparatus as in claim 29 wherein said donor is copper, wherein said organic electron acceptor is TCNQ and wherein said spectroscopic means detects the reflected spectrum at the frequency of 1451 $cm^{-1} \pm 25\ cm^{-1}$, wherein detection of said spectral line indicates that said location is in said second state.

41. The apparatus of claim 29 wherein said organic electron acceptor is the material selected from the group consisting of tetracyanoquinodimethane (TCNQ) and any of the TCNQ derivations defined by the notation:

TCNQ (OMe)
TCNQ (OMe)$_2$
TCNQ (OMe)(OEt)
TCNQ Cl
TCNQ Br
TCNQ ClMe
TCNQ Br Me
TCNQ I Me
TCNQ I
TCNQ (CN)2
TCNQ (Me)
TCNQ (Et)
TCNQ (i-Pr).

42. The apparatus of claim 41 wherein said donor is a metal and said metal is selected from a group consisting of silver and copper.

43. The apparatus of claim 42 wherein said spectroscopic means detects the presence of neutral molecules of said organic electron acceptor, said second state having more neutral molecules of said electron acceptor than said first state.

44. The apparatus as in claim 42 wherein said spectroscopic means measures the amplitude of at least one spectral band associated with neutral molecules of said organic electron acceptor, said at least one spectral band having a greater magnitude in said second state than said first state.

45. The apparatus of claim 29 further comprising:
a thermal erase means, brought in association with said organic charge transfer salt, for causing a location tion to return from said second state following illumination thereof to said first state.

46. The apparatus of claim 45 wherein said thermal erase means is an optical heating beam focused to generate heat on a portion of said organic salt.

47. The apparatus of claim 45 wherein said thermal erase means is an electrical heating element, generating heat on a portion of said organic salt.

48. The apparatus of claim 29 wherein said spectroscopic means further comprises:
a reading optical beam, illuminating selectively at least one of said plurality of locations, said reading optical beam having insufficient intensity to cause a location illuminated thereby to switch state; and,
a means for filtering and measuring the spectral light reflected from a location upon selective illumination by said reading optical beam and for determining if said location is in said first or said second state.

49. The apparatus of claim 48 wherein said reading optical beam is monochromatic light.

50. The apparatus of claim 48 wherein said reading optical beam is a laser.

51. The apparatus of claim 48 wherein said optical write beam and said reading optical beam are supplied by a single source of optical radiation having at least two power levels.

52. The apparatus as in claim 48 further comprising a means for directing said reading optical beam to a selected location of said plurality of locations.

53. A human readable optical device comprising:
a film of organic charge transfer salt formed from a donor complexed with an organic electron acceptor;
an optical write beam, illuminating one of a plurality of locations of the surface of said organic charge transfer salt, causing said one of a plurality of locations to undergo an electrochemical topotactic redox reaction which causes a charge transfer between said organic electron acceptor and said donor, causing a change in charge distribution and thereby causing said one of a plurality of locations to change from a first to a second color.

54. The apparatus of claim 53 wherein said second color closely resembles the color of neutral molecules of said organic electron acceptor.

55. The apparatus of claim 54 further comprising a means for sweeping and modulating said optical write beam so that at a visible high contrast pattern can be generated.

56. The apparatus of claim 54 further comprising:
a thermal erase means, brought in association with said organic charge transfer salt for causing said at least one of said plurality of locations to return to the first color.

57. An optoelectronic switch comprising:
a film of organic charge transfer salt, said film undergoing an electrochemical topotactic redox reaction when illuminated by optical radiation thereby switching from a first equilibrium state to a second state, said second state having a different electrical impedance from said equilibrium state; and,
a connecting means across said film for connecting said film electrically to an external circuit.

58. The apparatus of claim 57 wherein said switch is a bistable switch.

59. The apparatus of claim 57 wherein said switch is a threshold switch.

60. The apparatus of claim 59 further comprising:

a DC biasing voltage connected across said first and second electrodes for adjusting the level of optical radiation necessary to switch said organic charge transfer salt to said second state.

61. The apparatus as in claim 57 wherein said connecting means comprises:
   an electrically conductive substrate, said film of organic salt formed on said conductive substrate;
   a semitransparent electrical conducting film formed over at least a portion of said film of organic salt, said semitransparent conducting film allowing the passage of optical radiation to said film of organic salt;
   a first electrode attached to said conductive substrate; and,
   a second electrode attached to said semitransparent conducting film, wherein the impedance across said first and said second electrode will be switched from a high to a low state when said film of organic salt is illuminated by optical radiation.

62. The apparatus of claim 61 wherein the impedance across said first and said second electrode will return to said high impedance when said optical radiation no longer illuminates said film of organic salt.

63. The apparatus as in claim 61, wherein said conductive substrate is made from said donor and said film of organic charge transfer salt is formed on said conductive substrate by complexing said conductive substrate with said organic electron.

64. The apparatus of claim 61 wherein said donor is a metal and said metal is selected from the group consisting of copper, silver, lead, nickel, lithium, sodium, potassium, barium, chrome, molybdenum, tungsten, cobalt, iron, antimony, cesium, magnesium and having chemical properties which permit formation of an organic salt when complexed with said organic electron.

65. The apparatus of claim 61 wherein said donor is an organic material selected from the group consisting of tetrathioethylenes, dithiodynamino ethylenes, dithyodisalino ethyelynes, tetramino ethylenes, azenes, aromatic hydrocarbons, and aromatic hydromatic hydrocyclics and having chemical properties which permit formation of an organic salt when complexed with said organic electron acceptor.

66. The apparatus of claim 61 wherein said organic charge transfer salt will switch to said second state during the interval optical radiation exceeds a set threshold.

67. The apparatus of claim 61 further comprising:
   a DC biasing voltage connected across said first and second electrodes.

68. The apparatus of claim 61 wherein said organic charge transfer salt will switch to said second state for an indefinite time after said optical radiation which exceeds a second higher threshold is removed.

69. The apparatus of claim 68, wherein the accumulating effect of said biasing voltage and said optical radiation causes said organic charge transfer salt to switch impedance states.

70. The apparatus of claim 57 or 61 wherein said organic electron acceptor further comprises an organic material incorporating at least one cyanomethylene functional group and having the chemical properties which permit formation of an organic salt when complexed with said donor.

71. The apparatus of claim 57 or 61 wherein said organic electron acceptor further comprises an organic material incorporating at least one quinolene unit and having the chemical properties which permit formation of an organic salt when complexed with said donor.

72. The apparatus of claim 57 or 61 wherein said organic electron acceptor is a material selected from a group consisting of tetracyanoquinodimethane (TCNQ), tetracyanonapthoquinodimethane (TNAP), tetracyanoethylene (TCNE), and 2, 3 dichloro-5,6 dicyano-1, 4 benzoquinone (DDQ), hexacyanobutalene (HCBD), and 11, 11, 12, 12-tetracyano-1.4 naphthoquinodimethane (bento TCNQ), and 2,5-bis (dicyanomethalene)-2, 5-dihydrothiophene, and 2,5-bis (dicyanomethalene)-2, 5-selenophene, and thiophene-(T)-TCNQ, and (selenophene-(Se)-TCNQ) and tetracyano-quinoquinazolinoquinazoline (TCQQ) and hexacyanotrimethylene cyclopropane (HMCTMCP) and 2,4-bis (dicyanomethylene)-1,3-dithietan (BDDT), and any of the TCNQ derivatives defined by the notation:
   TCNQ(OMe)
   TCNQ(OMe)$_2$
   TCNQ(OMe)(OEt)
   TCNQ(OMe)(O-i-Pr)
   TCNQ(OMe)(O-i-Bu)
   TCNQ(O-i-C$_2$H$_5$)
   TCNQ(OEt)(SMe)
   TCNQ Cl
   TCNQ Br
   TCNQ ClMe
   TCNQ Br Me
   TCNQ IMe
   TCNQI
   TCNQ(OMe)(OCH$_3$)2
   TCNQ(CN)2
   TCNQ(Me)
   TCNQ(Et)
   TCNQ(i-Pr)
   TCNQ(i-Pr)2
   TCNQ(i-Pr)
   TCNQ(i-Pr)2.

73. The apparatus of claim 57 or 61 wherein said organic electron acceptor is a material selected from the group consisting of tetracyanoquinodimethane (TCNQ) and any of the TCNQ derivations defined by the notation:
   TCNQ (OMe)
   TCNQ (OMe)$_2$
   TCNQ (OMe)(OEt)
   TCNQ Cl
   TCNQ Br
   TCNQ ClMe
   TCNQ Br Me
   TCNQ I Me
   TCNQ I
   TCNQ (CN)$_2$
   TCNQ (Me)
   TCNQ (Et)
   TCNQ (i-Pr).

74. The apparatus of claim 73 wherein said donor is a metal wherein said metal is selected from the group consisting of silver and copper.

75. The apparatus of claim 74 wherein said film will be in a high impedance when in said equilibrium state and will be in a low impedance when said film is in said second state.

* * * * *

UNITED STATES PATENT AND TRADEMARK OFFICE
CERTIFICATE OF CORRECTION

PATENT NO. : 4,574,366
DATED : March 4, 1986
INVENTOR(S) : Potember et al

It is certified that error appears in the above—identified patent and that said Letters Patent is hereby corrected as shown below:

In the claims:

Column 13, line 26, after "equilibrium" insert -- state --.

Column 19, line 29, after "electron" insert -- acceptor --.

Signed and Sealed this

Twenty-ninth Day of December, 1987

Attest:

DONALD J. QUIGG

*Attesting Officer*      *Commissioner of Patents and Trademarks*